United States Patent
Nabielec (10) Patent No.: US 9,331,662 B2
(45) Date of Patent: May 3, 2016

(54) ADAPTIVE VOLTAGE DIVIDER WITH CORRECTED FREQUENCY CHARACTERISTIC FOR MEASURING HIGH VOLTAGES

(75) Inventor: Jerzy Nabielec, Krakow (PL)

(73) Assignee: AKADEMIA GORNICZO-HUTNICZA IM. STANISLAWA STASZICA W KRAKOWIE, Krakow (PL)

( * ) Notice: Subject to any disclaimer, the term of this patent is extended or adjusted under 35 U.S.C. 154(b) by 131 days.

(21) Appl. No.: 14/236,912

(22) PCT Filed: Aug. 17, 2012

(86) PCT No.: PCT/EP2012/066147
§ 371 (c)(1),
(2), (4) Date: Feb. 4, 2014

(87) PCT Pub. No.: WO2013/026805
PCT Pub. Date: Feb. 28, 2013

(65) Prior Publication Data
US 2014/0159701 A1    Jun. 12, 2014

(30) Foreign Application Priority Data
Aug. 19, 2011   (PL) .......................................... 396031

(51) Int. Cl.
*H03H 7/24*     (2006.01)
*G01R 15/06*    (2006.01)

(52) U.S. Cl.
CPC . *H03H 7/24* (2013.01); *G01R 15/06* (2013.01)

(58) Field of Classification Search
CPC .......... H03H 7/24; G01R 15/06; G01R 15/04; G01R 17/105
See application file for complete search history.

(56) References Cited

U.S. PATENT DOCUMENTS 3,256,484 A    6/1966 Terry
4,489,270 A    12/1984 Diller
(Continued)

FOREIGN PATENT DOCUMENTS

| DE | 2122917 A1 | 11/1972 |
|----|------------|---------|
| NZ | 524719     | 6/2004  |
| SU | 2399920    | 8/1990  |

*Primary Examiner* — Jessica Han
*Assistant Examiner* — Bart Iliya
(74) *Attorney, Agent, or Firm* — Mark M. Friedman (57) ABSTRACT

An adaptive voltage divider for measuring a high voltage between a ground terminal (GND) and a measurement terminal (U). It comprises a first branch comprising a first set of impedance elements (Z, R) forming a voltage divider circuit connected between the ground terminals (GND) and the measurement terminal (U) and a voltage meter (AD2) configured to measure voltage on one of the impedance elements (Z, R) of the first branch. Furthermore, it comprises a second branch comprising a second set of impedance elements (Q, P) connected between the ground terminal (GND) and the measurement terminal (U) and switchable between a plurality of configurations, wherein in at least one configuration the second set of impedance elements (Q, P) forms a voltage divider circuit, and voltage meters (AD1, AD3) configured to measure voltage on at least one of the impedance elements (Q, P) of the second branch. Moreover, a control circuit (DCSS) is configured to consecutively switch the configuration of the second branch between the plurality of configurations thereof, such that the relationships between the values of impedance elements (Z, R) of the first branch and the values of impedance elements (Q, P) of the second branch can be determined for consecutive configurations of the second branch as a function of the outputs of the voltage meters (AD1, AD2, AD3) and the total transmittance of the voltage divider can be determined at any instance as a function of the outputs of the voltage meters (AD1, AD2, AD3).

6 Claims, 4 Drawing Sheets

(56) References Cited

U.S. PATENT DOCUMENTS

| | | | | |
|---|---|---|---|---|
| 6,040,741 A | * | 3/2000 | Van der Pol | H03F 1/0233 330/297 |
| 6,100,750 A | | 8/2000 | Van Der Zee | |
| 6,448,745 B1 | * | 9/2002 | Killat | H02M 3/157 323/212 |
| 2003/0080812 A1 | * | 5/2003 | Allinger | G01R 15/04 330/69 |
| 2004/0189330 A1 | * | 9/2004 | Herb | G01R 27/18 324/691 |
| 2006/0012382 A1 | * | 1/2006 | Yakymyshyn | G01R 15/06 324/705 |
| 2008/0136403 A1 | * | 6/2008 | Deck | G01R 15/181 324/110 |
| 2008/0259013 A1 | * | 10/2008 | Kobayashi | G09G 3/20 345/89 |

* cited by examiner

ADAPTIVE VOLTAGE DIVIDER WITH CORRECTED FREQUENCY CHARACTERISTIC FOR MEASURING HIGH VOLTAGES

TECHNICAL FIELD

The present invention relates to an adaptive voltage divider with corrected frequency characteristic for measuring high voltages.

BACKGROUND ART

Classic voltage dividers: resistive, inductive or capacitive, have a number of drawbacks that will be discussed further below.

Firstly, the voltage divider ratio varies in time due to components ageing or ambient conditions such as temperature, humidity or environment pollution. For instance, changes in air humidity cause changes in the leakage resistances shunting the divider impedances and thereby result in uncontrolled changes in the divider ratio. Similarly, external pollutants (dust, fat) shunting the divider elements give rise to uncontrolled changes in the divider ratio. Moreover, loading a divider with finite impedance also changes the divider ratio.

Also dynamic properties of a voltage divider are subject to changes. Besides of resistance components, each voltage divider comprises parasitic reactance elements. Inductive dividers inherently comprise reactance elements. Capacities of parasitic capacitances are varying in an uncontrolled manner due to the presence or relocation of extraneous conductors in the voltage divider vicinity. Changes in the voltage divider geometry due to thermal expansion of its elements result in changes of capacities present in the divider. Uncontrolled changes in capacity can be caused by temperature and humidity or even by air pressure influence on the air dielectric constant. Furthermore, ageing of dielectric material also results in uncontrolled changes in capacitance. Since each conducting element has an inductance, an undetermined parasitic magnetic coupling always occurs between the main circuit and conducting elements in its vicinity. Parasitic capacitances or inductances form resonant circuits that substantially change the voltage divider metrological properties, particularly for signals containing high harmonics. There are known instances of ferroresonance occurrences in inductive voltage dividers that substantially distort the amplitude and frequency characteristics of a voltage divider.

It was therefore purposeful to develop an adaptive voltage divider avoiding at least a part of these disadvantages.

From the United States patent specification No. U.S. Pat. No. 3,256,484 is known a high voltage oscilloscope test probe whereof high quality of insulation is provided by a dielectric fluid that partially fills a container in which a voltage divider is enclosed. Since the employed freon dielectric fluid boiling point is +4.1 degrees Celsius the remaining part of the container is filled with the dielectric fluid vapour under pressure. Thus the insulation strength in the voltage divider surrounding is increased several times with respect to that of air. The probe allows measuring high voltages up to 30 kV within frequency range DC-70 MHz and a rise time of approximately 3.3 nanoseconds.

From the Russian patent application No. RU 2399920 is known a method for contactless measuring of voltage and current distortion factor in electric traction lines in which electric field and magnetic field sensors are fixed at the end of a two-meter rod and placed below a trolley wire. The signals of both sensors are applied to inputs of a dual channel oscilloscope connected with a computer by means of which a synchronous recording and spectral analysis of signals are performed.

A disadvantage of the probe according to U.S. Pat. No. 3,256,484 is the necessity for maintaining a specified amount of freon in the probe. On the other hand, polymer insulating materials, due to unavoidable surface currents do not ensure stable capacitance and conductance parameters under varying ambient conditions (humidity, dust). This results in an uncontrolled change in the probe both static and frequency metrological properties.

DISCLOSURE OF THE INVENTION

The object of the invention is an adaptive voltage divider for measuring a high voltage between a ground terminal (GND) and a measurement terminal (U). The divider comprises a first branch comprising a first set of impedance elements (Z, R) forming a voltage divider circuit connected between the ground terminals (GND) and the measurement terminal (U) and a voltage meter (AD2) configured to measure voltage on one of the impedance elements (Z, R) of the first branch. Moreover, the divider comprises a second branch comprising a second set of impedance elements (Q, P) connected between the ground terminal (GND) and the measurement terminal (U) and switchable between a plurality of configurations, wherein in at least one configuration the second set of impedance elements (Q, P) forms a voltage divider circuit, and voltage meters (AD1, AD3) configured to measure voltage on at least one of the impedance elements (Q, P) of the second branch. Furthermore, the divider comprises a control circuit (DCSS) configured to consecutively switch the configuration of the second branch between the plurality of configurations thereof, such that the relationships between the values of impedance elements (Z, R) of the first branch and the values of impedance elements (Q, P) of the second branch can be determined for consecutive configurations of the second branch as a function of the outputs of the voltage meters (AD1, AD2, AD3) and the total transmittance of the voltage divider can be determined at any instance as a function of the outputs of the voltage meters (AD1, AD2, AD3).

The first branch may comprise a first impedance element (Z) connected in series with a second impedance element (R) to which a voltage follower (W2) is connected, the voltage follower (W2) further connected with a voltage meter (AD2) and the second branch may comprise a first impedance element (Q) connected in series with a second impedance element (P) to which a voltage follower (W1) is connected, the voltage follower (W1) further connected with a voltage meter (AD1), and further comprising a switch (Sw) for switchably connecting the second terminal of the impedance element (P) to the ground terminal (GND) or to the output of an amplifier (W3), the output of the amplifier (W3) being connected with a voltage meter (AD3). The second branch can be switchable between a first configuration, wherein the switch (Sw) connects the impedance element (P) to the ground and a second configuration, wherein the switch (Sw) connects the impedance element (P) to the output of the amplifier (W3).

The first branch may comprise a first impedance element (Z) connected in series with a second impedance element (R) to which a voltage meter (AD2) is connected and the second branch may comprise at least three impedances (Q, T, P) connectable via switches (Sq, Stp, Sw) to at least three configurations, wherein the first configuration comprises a series connection of the first impedance (Q) and the second impedance (T), the second configuration comprises a series connection of the first impedance (Q) and the third impedance (P)

and the third configuration comprises a series connection of all three impedances (Q, T, P).

The second branch comprises a first impedance (Q) connected in series with a first selector switch (Sq) having a selector terminal switchable between a second impedance (T) and a third impedance (P) having a common terminal connected via a second switch (Sw) to the ground terminal (GND), and further comprising a third switch (Stp) between the selector terminal of the first selector switch (Sq) and the ground terminal (GND). The divider may further comprise a circuit (Ww, Wi, T1, P1) connectable in the third configuration in parallel with the series connection of the second and third impedance (T, P) to minimize the effects of CMRR.

The first branch and the second branch may each comprise a chain of mutually loaded voltage dividers.

Determination of the switchable branch ratio for each embodiment of the voltage divider according to the invention allows for simultaneous determination of the divider classic (non-switchable) branch ratio and employing the relations given in the first embodiment description.

BRIEF DESCRIPTION OF DRAWINGS

The adaptive voltage divider according to the present invention in exemplary embodiments is shown in drawing in which.

MODES FOR CARRYING OUT THE INVENTION

The First Embodiment of the Invention

Figure 1:
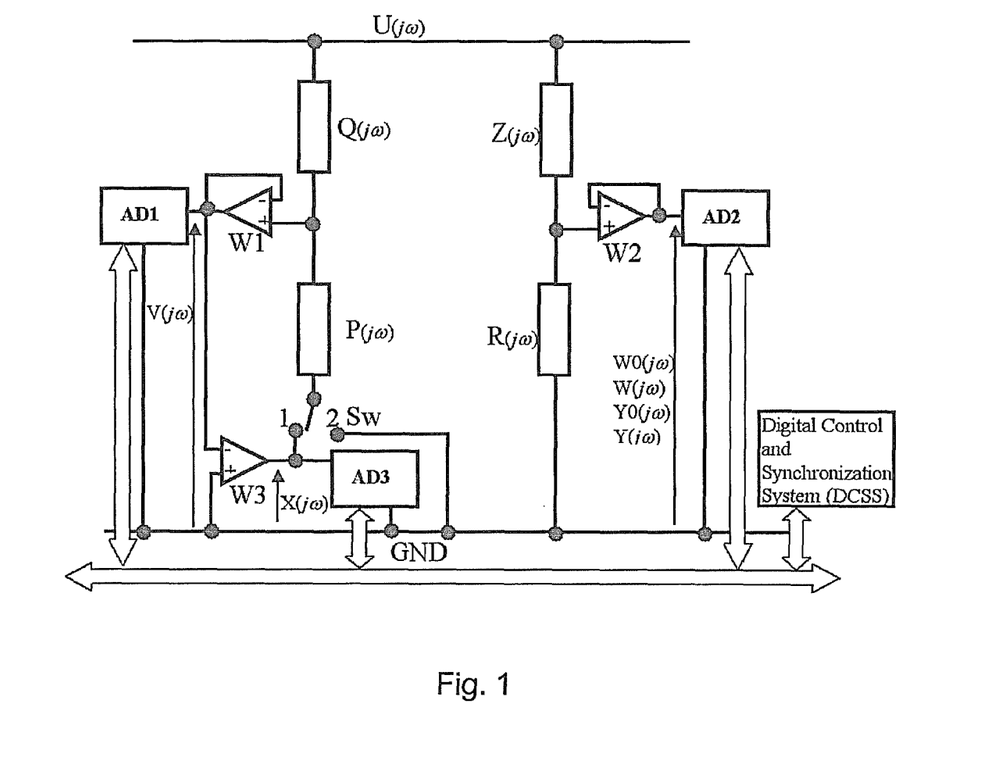
FIG. 1 shows the first example embodiment of the adaptive voltage divider according to the present invention.

The adaptive voltage divider with corrected frequency characteristic for measuring high voltages according to the first example embodiment shown in FIG. 1. It comprises two branches—in the first branch impedance Q(jω) and impedance P(jω), which are connected to the first voltage follower whereof output is further connected to the first analog-to-digital converter whereas in its second branch it has series-connected impedance Z(jω) and impedance R(jω), connected to the second voltage follower whereof output is connected to second analog-to-digital converter. The adaptive voltage divider is furthermore provided with a switch Sw that allows to disconnect impedance P(jω) from the zero-potential terminal and connects it to the amplifier output whereof output is connected to the third analog-to-digital converter.

The adaptive voltage divider comprises: the impedance Q(jω) whereof one end is connected to the noninverting input of the first voltage follower W1 employing an operational amplifier with high input resistance, furthermore the impedance Q(jω) is connected to the first end of the impedance P(jω). The first voltage follower W1 output is connected to the first voltage meter, i.e. an analog-to-digital converter AD1. The impedance P(jω) may be connected by means of the switch Sw, in the second position of switch Sw to the zero-potential terminal or in the first position of switch Sw to the output of amplifier W3. Since the noninverting input of the amplifier W3 is also connected to the zero-potential terminal, whereas the inverting input of said amplifier W3 is connected to the amplifier W1 output, in the first position of switch Sw the amplifier W3 whereof output is connected with impedance P(jω), functions as an inverting amplifier whose output is connected to the third analog-to-digital converter AD3. In the second branch the impedance Z(jω) is also connected with a conductor whose voltage is measured, the impedance R(jω) and with the input of second voltage follower W2 whereof output is connected to the second analog-to-digital converter AD2.

Alternating voltages are measured by means of the impedance voltage divider with impedances Z(jω), R(jω) in which the ratio of the employed impedances is computed from additional measurements of the inverting amplifier W3 output voltage. Thus, it is not necessary to know the values of both impedances employed in the voltage divider circuit.

In consequence of the of execution of the measurements sequence consisting of four phases are determined actual transfer functions of the voltage divider comprising configuration of impedances Z(jω), R(jω) of unknown values.

The measurement process contains the following phases:

Phase 1.

Switch Sw is Set to Position 2.

Analog-to-digital converter AD1 acquires the specified number N of voltage samples from which the voltage frequency spectrum denoted V(jω) is determined.

Analog-to-digital converter AD2 acquires the specified number N of voltage samples from which the voltage frequency spectrum denoted W(jω) is determined.

The above measurements are performed simultaneously, i.e. voltage samples in both measurement paths are acquired at the same time instants. Both analog-to-digital converters AD1 and AD2 operate synchronously.

The remaining voltages X(jω), Y(jω), W0(jω) and Y0(jω) are insignificant in this phase. N is a parameter software-determined by the Digital Control and Synchronization System.

The number N of acquired samples should enable Fourier analysis for all harmonics present in at least 1 cycle of sampled signal. For example, the signal sampling frequency 50 kHz allows acquiring 1000 samples during a single cycle of 50 Hz signal.

Phase 2

Switch Sw is switched to position 1.

In this phase only the recording of N voltage samples by AD2 and determining the voltage frequency spectrum denoted W0(jω) is significant.

Phase 3.

Switch Sw is set to position 1.

Analog-to-digital converter AD3 acquires the specified number N of voltage samples from which the voltage frequency spectrum denoted X(jω) is determined.

Analog-to-digital converter AD2 acquires the specified number N of voltage samples from which the voltage frequency spectrum denoted Y(jω) determined The measurements are performed simultaneously, i.e. voltage samples in both measurement paths are acquired at the same time instants.

The remaining voltages V(jω), W(jω), W0(jω) and Y0(jω) are insignificant in this phase.

Phase 4.

Switch Sw is switched to position 2.

In this phase only recording of N voltage samples by AD2 and determining the voltage frequency spectrum denoted Y0(jω) is significant.

The result of numerical operations on the recorded samples of voltages X(jω), Y(jω), V(jω) and W(jω) is determination of the divider constant as a quotient of the divider right branch total impedance by its low-voltage part R(jω), expressed as a complex number.

The final relations in the domain of complex variable jω are:

$$G(j\omega) = \frac{Z(j\omega) + R(j\omega)}{R(j\omega)} = \frac{V(j\omega)}{W(j\omega) + V(j\omega)\frac{Y(j\omega)}{X(j\omega)}}$$

Determination of the voltage divider transmittance is performed after the first cycle of the voltage divider operation.

Thus in subsequent operation cycles the divider metrological properties are already determined although for its construction were used components with undetermined parameters.

In further cycles the system follows, without interrupting the measurement continuity, slow fluctuations of its components' parameters that may be changing due to varying weather (ambient) conditions or ageing. The transmittance is thus determined on site and not in a laboratory. The sole activation signal needed for identification is the measured unknown voltage.

Transmittances of the voltage divider are determined as complex numbers. This allows determining attenuation and phase-shift of each detected harmonic in the measured voltage U(jω).

Using these transmittances the voltage U(jω) waveform is determined from the recorded samples of voltages X(jω), Y(jω), V(jω), V0(jω), W(jω), W0(jω).

The value of the measured voltage is determined depending on the divider operation phase from the measurement results obtained from analog-to-digital converter AD2.

U(jω)=G(jω)W(jω) for phase 1
U(jω)=G(jω)W0(jω) for phase 2
U(jω)=G(jω)Y(jω) for phase 3
U(jω)=G(jω)Y0(jω) for phase 4

The measurement process is supervised by the Digital Control and Synchronization System which sets the measurements sequence by means of analog-to-digital converters AD1, AD2, AD3, alters the voltage divider configuration by appropriate positioning the switch Sw, by means of software executes correction of the voltage divider frequency characteristic, and performs computations.

During successive cycles of the voltage divider operation the impedance connected in parallel with analog-to-digital converter AD2 can be tuned so that the ratio of this branch is a real number for chosen frequency and not a complex one.

The Second Embodiment of the Invention

Figure 2:
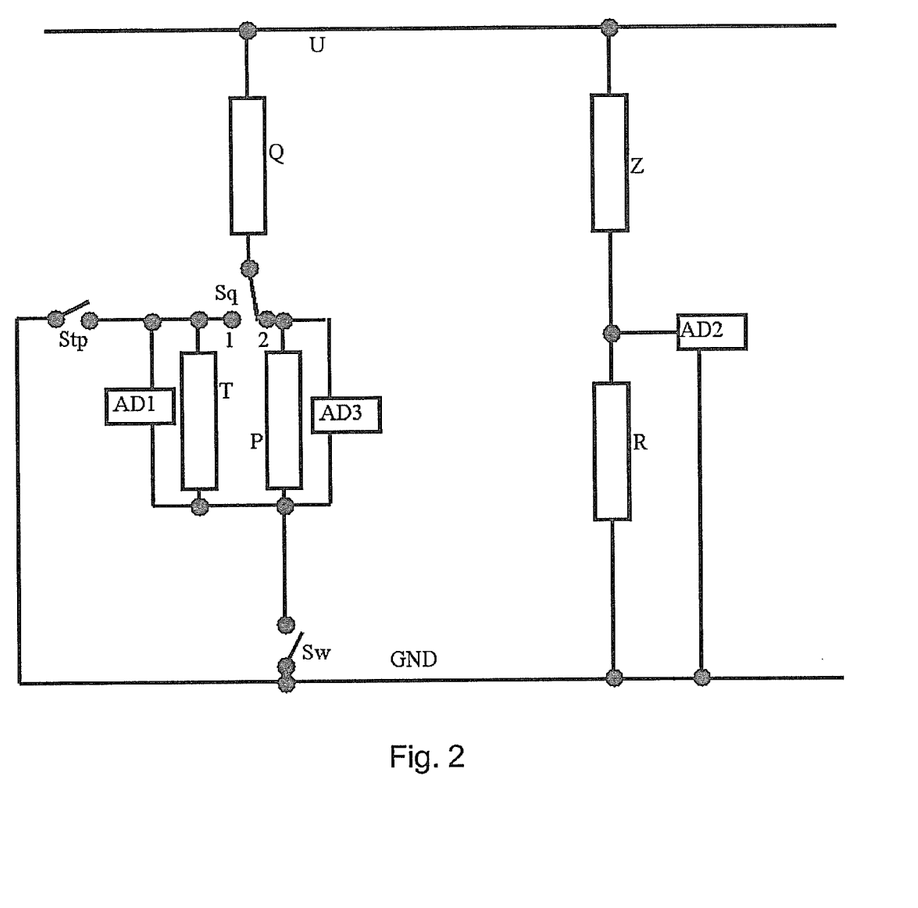
FIG. 2 shows the second example embodiment of the adaptive voltage divider according to the present invention.

Configuration of the second example embodiment of the adaptive voltage divider according to the present invention is shown in FIG. 2.

For the sake of clarity of the description and figures, the impedances will be thereinafter denoted respectively by letters P, Q, etc. instead of P(jω), Q(jω), etc.

Impedance Q is connected in series through switch Sq, with a parallel connection of impedance T and analog-to-digital converter AD1 or with a parallel connection of impedance P and analog-to-digital converter AD2 whereas the common node of impedances Q and T is connected with switch Sw. Switch Stp provides connection of impedance Q to ground potential.

In the adaptive voltage divider the measurement signal is not passing through active elements, such as operational amplifiers, whose measuring properties would influence the measurement quality. The measurement signal passes only through passive elements whose dynamic properties are identified by the measuring system. All operations on the divider elements are performed exclusively in low-voltage circuits at voltages comprised in the −10V to +10V range.

The values of impedances P, Q, Z, R and T should be estimated so as to ensure that measured signals are comprised within the permissible range of analog-to-digital converters input voltage.

Analog-to-digital converters AD1 and AD3 are operated in a differential mode. Input impedances of analog-to-digital converters are accounted for when determining impedances R, P and T, respectively.

Impedances R and T substantially differ from each other.

The Adaptive Voltage Divider Operation Phases:

Phase 1.
Switch Sq is set to position 2, switch Stp is open, switch Sw is in the closed position. The voltage measurements are performed by means of analog-to-digital converters AD2 and AD3. In this phase the relations between impedances Q and P, and Z and R are determined.

Phase 2.
Switch Sq is set to position 1, switch Stp is open, switch Sw is in the closed position. The voltage measurements are performed by means of analog-to-digital converters AD1 and AD2. In this phase relations between impedances Q and T, and Z and R are determined.

Phase 3.
Switch Sq is set to position 2, switch Stp is closed, switch Sw is in the open position. The voltage measurements are performed by means of analog-to-digital converters AD1, AD2 and AD3. In this phase the relation between impedances T and P can be determined. Taking into account relations determined in preceding phases the relation between impedances P and Q can be determined.

The measured voltage value can be determined from the provided relations in the post-processing mode during successive operation phases, similarly as described in the first embodiment description.

This embodiment is particularly suitable for the following applications:
  Measuring instruments used in power systems, electricity meters, spectrum analysers, power quality analysers, etc.;
  Power electronic systems, electric drive control, high speed centrifuge magnetic bearings control;
  Input circuits in measuring instrumentation used for verification of dynamic properties of electrical equipment.

The Third Embodiment of the Invention

Figure 3:
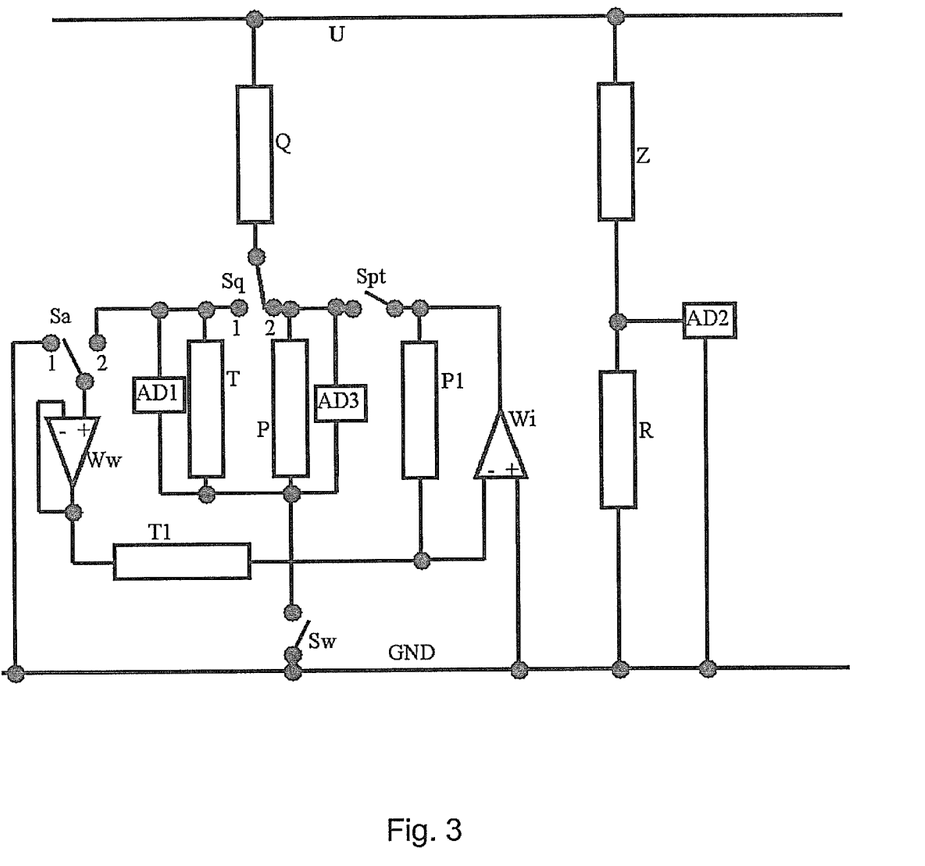
FIG. 3 shows the third example embodiment of the adaptive voltage divider according to the present invention.

Configuration of the third example embodiment of the adaptive voltage divider according to the present invention is shown in FIG. 3.

This example embodiment is an extension of the example embodiment shown in FIG. 2 with the following modifications.

The value of impedance T1 should be approximate to the value of impedance T with a tolerance of several percent, similarly the value of impedance P1 should be approximate to the value of impedance P with a tolerance of several percent.

The Adaptive Voltage Divider Operation Phases:

Phase 1.
Switch Sa is set to position 1, switch Sq is set to position 2, switch Spt is open, switch Sw is in the closed position. The voltage measurements are performed by means of analog-todigital converters AD2 and AD3. In this phase the relations between impedances Q and P, and Z and R are determined.
Phase 2.
Switch Sa is set to position 1, switch Sq is set to position 1, switch Spt is open, switch Sw is in the closed position. The voltage measurements are performed by means of analog-to-digital converters AD1 and AD2. In this phase the relations between impedances Q and T, and Z and R are determined.
Phase 3.
Switch Sa is set to position 2, switch Sq is set to position 1, switch Stp is closed, switch Sw is in the open position. The voltage measurements are performed by means of analog-to-digital converters AD1, AD2 and AD3. In this phase amplifiers Ww and Wi polarize impedances T and P so that relations between impedances T and P can be determined. Potential of the common point between impedances T and P is in this phase close to the ground potential thus minimizing adverse effects of CMRR (Common Mode Rejection Ratio). Taking into account relations determined in preceding phases the relation between impedances P and Q can be determined.

The value of the measured voltage can be determined from provided relations in the post-processing mode during successive operation phases, similarly as described in the first embodiment description.

The Fourth Embodiment of the Invention

Figure 4:
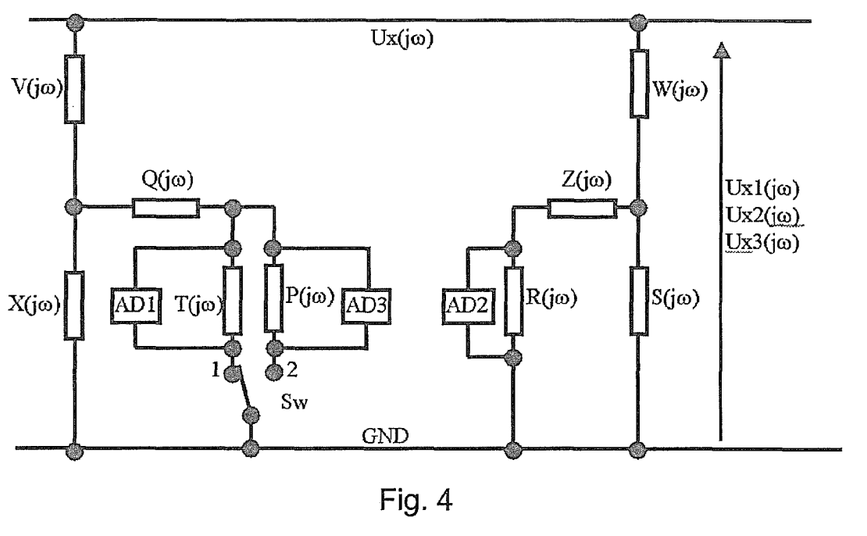
FIG. 4 shows the fourth example embodiment of the adaptive voltage divider according to the present invention.

Configuration of the fourth example embodiment of the adaptive voltage divider according to the present invention is shown in FIG. 4.

This example embodiment employs a chain of mutually loaded voltage dividers in order to reduce the voltage applied to measuring instruments inputs.

The operation principle and calculations are based on Thevenin's theorem.

It is assumed that input impedances of analog-to-digital converters AD1, AD2, AD3 are accounted for in the impedances $T(j\omega)$, $R(j\omega)$, $P(j\omega)$ respectively.

Before altering the voltage divider configuration the auxiliary switch Sp is closed to shorten the common node of impedances $Q(j\omega)$, $T(j\omega)$ and $P(j\omega)$ with analog ground GND, and after completion of the alteration process it is opened. The purpose of the auxiliary switch Sp is to protect analog-to-digital converters against too high voltages that may occur during the switch undetermined state while switching between positions 1 and 2.

Analog-to-digital converters operate synchronously, i.e. samples are acquired at the same time instants. Analog-to-digital converter AD2 always performs measurement, independently from the divider configuration, also during alterations of the configuration. Thus the result of an overhead line conductor voltage measurement is always available.

The Adaptive Voltage Divider Operation Phases:
Phase 1.
Unknown voltage Ux1(jω) of an overhead line is measured with respect to analog ground GND, switch Sw is set to position 1. Recorded are voltages denoted by U11(jω) and U12(jω) measured by analog-to-digital converters AD1 and AD2, respectively.

$$U11(j\omega) = \frac{X(j\omega)}{X(j\omega) + V(j\omega)} U \times 1(j\omega) \frac{T(j\omega)}{T(j\omega) + Q(j\omega) + \frac{X(j\omega)V(j\omega)}{X(j\omega) + V(j\omega)}}$$

$$U12(j\omega) = \frac{S(j\omega)}{S(j\omega) + W(j\omega)} U \times 1(j\omega) \frac{R(j\omega)}{R(j\omega) + Z(j\omega) + \frac{S(j\omega)W(j\omega)}{S(j\omega) + W(j\omega)}}$$

Dividing each side of the first equation by corresponding sides of the second equation and rearranging its items yields:

$$\frac{U11(j\omega)}{U12(j\omega)} = \frac{\frac{T(j\omega)X(j\omega)}{[T(j\omega) + Q(j\omega)][X(j\omega) + V(j\omega)] + X(j\omega)V(j\omega)}}{\frac{R(j\omega)S(j\omega)}{[R(j\omega) + Z(j\omega)][S(j\omega) + W(j\omega)] + S(j\omega)W(j\omega)}}$$

Phase 2.
Switch Sw is set to position 2. Another voltage Ux2(jω) of an overhead line is measured. Recorded are voltages denoted by U22(jω) and U23(jω) measured by analog-to-digital converters AD2 and AD3, respectively. Equation that describes this configuration of the voltage divider has identical structure, impedance P(jω) is taken instead of impedance T(jω).

$$\frac{U23(j\omega)}{U22(j\omega)} = \frac{\frac{P(j\omega)X(j\omega)}{[P(j\omega) + Q(j\omega)][X(j\omega) + V(j\omega)] + X(j\omega)V(j\omega)}}{\frac{R(j\omega)S(j\omega)}{[R(j\omega) + Z(j\omega)][S(j\omega) + W(j\omega)] + S(j\omega)W(j\omega)}}$$

Phase 3.
Switch Sw is set to position 2. In the measured overhead line may occur a different voltage Ux3(jω). Impedance T(jω) is connected in series between impedances Q(jω) and P(jω). Configuration of these impedances is identical as for the phase 3 of the second embodiment. Voltages denoted by U31(jω), U32(jω) and U33(jω) are measured by analog-to-digital converters AD1, AD2 and AD3, respectively.

Figure 5:
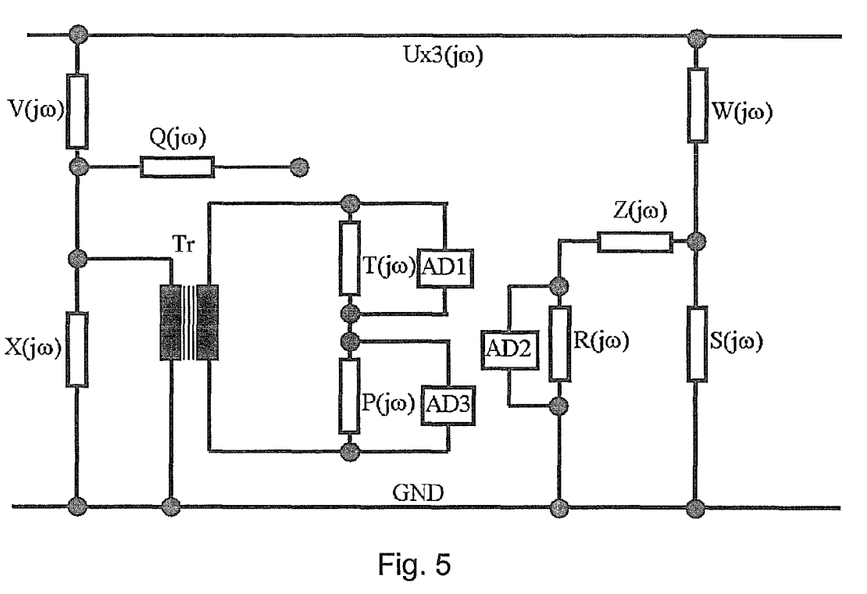
FIG. 5 shows the concept of elimination of the negative impact of CMRR in the fourth embodiment.

Alternatively, in order to eliminate the negative impact of CMRR in the third phase, the serially-connected impedances P(jω) i T(jω) are connected to a secondary winding of a small-power Tr transformer, having a primary winding connected between the GND potential and the common point of impedances Q(jω), X(jω), V(jω), as shown in FIG. 5.

$$\frac{U33(j\omega)}{U31(j\omega)} = \frac{P(j\omega)}{T(j\omega)}$$

After transformations the voltage divider ratio is uniquely determined as a complex number a(jω) by equation for each harmonic of the recorded voltage.

$$a(j\omega) = \frac{T(j\omega)}{T(j\omega) + Q(j\omega) + \frac{X(j\omega)V(j\omega)}{X(j\omega) + V(j\omega)}} = \frac{\frac{U22(j\omega)U11(j\omega)U33(j\omega)}{U23(j\omega)U12(j\omega)U31(j\omega)} - 1}{\frac{U33(j\omega)}{U31(j\omega)} - 1}$$

From that time onwards the voltage divider metrological properties are determined for the given site and operating conditions.

After completion of the first cycle of phases 1, 2 and 3, these phases should be cyclically recurred in order to detect possible changes in the voltage divider components properties.

SUMMARY

There are also possible other example embodiments where one of the analog-to-digital converters measures a voltage in the voltage divider classic configuration, whereas two other analog-to-digital converters measure the same alternating voltage in order to determine mutual corrections of their own characteristics. One of these analog-to-digital converters is regarded as a reference converter.

In the subsequent phase the reference converter is connected in parallel to that converter which formerly was employed as the measuring one, whereas the converter that formerly was checked takes over the function of the classic voltage divider configuration.

There is also a possible to implement auto-zeroing phase of the pair of analog-to-digital converters being compared while the remaining converter operates in the classic configuration.

The basic feature, common for all embodiments of the present invention, is the fact of altering one of the voltage divider branches configuration by means of switches (e.g. reed switches) controlled by a supervisory central control unit. This alteration of the divider configuration is performed at the low-voltage side and should be made when the point of connection of the voltage divider impedances is safely shorted through a contact to the analog ground potential GND.

The adaptive voltage divider according to the present invention enables on-site determination of its mathematical model coefficients under site-specific operating conditions and during the divider operation employing exclusively the measured signal as an activation signal for identification procedures. Determination of the model coefficients is carried out for a DC component of the measured signal and for each alternating component with frequency that is detectable by means of Fourier analysis of the recorded signal. The identification procedure is performed cyclically with a period which is an integer multiple of the measured signal period. Uncertainty of the result of a voltage instantaneous value measurement depends mainly on the analog-to-digital converter measurement uncertainty. Uncertainty of the voltage measurement is entirely independent from values of the voltage divider components.

If parameters of the voltage divider components will change, e.g. due to ageing or environmental factors, their new values will be immediately determined. These values will be immediately entered into a numerical procedure, which computes the result of a voltage instantaneous value measurement. The voltage divider errors, both static and dynamic (modulus and angle) are immediately computationally corrected. All operations associated with the measurement procedure (alterations of the divider structure) are exclusively performed in low-voltage circuits. Such solution facilitates periodic maintenance work.

Periodic verification of the voltage divider metrological properties may be reduced to checking the quality of an analog-to-digital converter operation. This procedure can be even performed without disassembling of the measuring system from it operation site. The procedure can be performed separately for each voltage divider branch without the necessity of disconnecting the other branch.

If permitted by health and safety regulations, the voltage divider maintenance can be carried out without disconnecting it from the circuit in which the voltage is measured.

Grounding of the common point between impedances of one branch is sufficient for safe execution of maintenance work. During maintenance work carried out in one branch of the voltage divider the other branch can be operated. Clearly, in such situation adaptive procedures are deactivated and for the operating branch correction are used its formerly determined parameters. The correction of recorded results is also possible in the post-processing mode, after updating the divider model coefficients.

The analogue, low-voltage (about 10V) measuring part of the divider can be moved away from the high-voltage part.

Parasitic impedance elements of a cable connecting these parts (e.g. a coaxial cable or twisted pair) do not affect the measurement result because these elements are determined in the auto-identification process and are accounted for in final relations.

For standard voltage dividers the maximum permissible length of a cable transmitting signals to measuring instruments is specified. For the adaptive voltage divider according to the invention the length of such connection is not critical.

Metrological properties of the adaptive voltage divider can be precisely verified by means of very accurate direct current instruments. Metrological properties for alternating signals are computationally determined. A similar procedure is employed to verification of electrodynamic wattmeters.

For construction of the voltage divider according to the present invention are sufficient cheap resistive, capacitive or inductive components without the need for precise determination of their parameters. Only a coarse estimation of the divider impedance is required to make sure that its output voltage covers about 80% of the input voltage range of employed analog-to-digital converters. Integrated semiconductor devices, e.g. 24-bit analog-to-digital converters, become increasingly cheaper and offer better measurement properties. Metrological properties of the voltage divider of depend mainly on analog-to-digital converters precision and the sameness of their characteristics. Therefore the voltage divider operation incorporates stages during which analog-to-digital converters metrological properties are cyclically verified with respect to the chosen converter.

The voltage divider algorithm can simultaneously execute self-diagnosis procedure. Rapidly changing parameters of the voltage divider may indicate the system failure. Information about such event can be promptly transferred to maintenance services.

An additional advantageous feature of the adaptive voltage divider according to the present invention is the easy connection of a fibre-optic communication link that allows integrating the divider with power system control equipment.

The adaptive voltage divider according to the present invention can be employed in the following areas of application:
- Voltage circuits of measuring instruments used for metering electric energy consumption, power quality measuring and recording disturbances propagation in power lines;
- Voltage circuits of phasor measurement units (PMUs) that principally require measuring of instantaneous voltage values with possible minimum phase error;
- Power Stabilization System whose purpose is damping of power system oscillations requires a precise measuring of instantaneous voltage values in transmission lines;

Real time control of high-speed magnetic bearings;
Power electronic systems;
Instruments generating test signals with the defined rate of signal change. The adaptive voltage divider enables measuring dynamic properties of signals without the need to use of expensive and awkward measurement references of resistance, inductance or capacitance.

The adaptive voltage divider can be used as an alternative for Schering bridge, employing only one reference element in the low voltage circuit.

The invention claimed is:

1. An adaptive voltage divider for measuring high voltages between a ground terminal and a measurement terminal, the adaptive voltage divider comprising:
a first branch comprising a first impedance element and a second impedance element connected between the ground terminal and the measurement terminal, the first branch being switchable between a plurality of configurations, wherein in at least one configuration the first impedance element and the second impedance element form a voltage divider circuit, and a first voltage meter and a third voltage meter configured to measure voltage on at least one of the first impedance element and the second impedance element;
a second branch comprising a third impedance element and a fourth impedance element forming a voltage divider circuit connected between the ground terminal and the measurement terminal and a second voltage meter configured to measure voltage on one of the third impedance element and the fourth impedance element;
a control circuit configured to consecutively alter the configuration of the first branch between the plurality of configurations of the first branch and to determine the transmittance of the voltage divider based on relationships between the values of the third impedance element and the fourth impedance element calculated as a function of the outputs of the first, second and third voltage meters measured for consecutive configurations of the first branch;
wherein the second branch comprises the third impedance element connected in series with the fourth impedance element to which the second v meter is connected; and
wherein the first branch corn rises the first impedance element, the second impedance element, and a fifth impedance element connectable via the first switch, a second switch and a third switch to three configurations, wherein the first configuration comprises a series connection of the first impedance and the fifth impedance element, second configuration comprises a series connection of the first impedance element and the second impedance element and the third configuration comprises a series connection of the first impedance element, the second impedance element, and the fifth impedance element.

2. The adaptive voltage divider according to claim 1, wherein:
the second branch comprises the third impedance element connected in series with the fourth impedance element to which a first voltage follower is connected, the first voltage follower further connected with the second voltage meter, and
the first branch comprises the first impedance element connected in series with the second impedance element to which a second voltage follower is connected, the second voltage follower further connected with the first voltage meter, and further comprising a first switch for switchably connecting a terminal of the second impedance element to the ground terminal or to the output of a first amplifier, the output of the first amplifier being connected with the third voltage meter.

3. The adaptive voltage divider according to claim 2, wherein the first branch is switchable between:
a first configuration, wherein the first switch connects the second impedance element to the ground terminal, and
a second configuration, wherein the first switch connects the second impedance element to the output of the first amplifier.

4. The adaptive voltage divider according to claim 1, wherein the first branch comprises the first impedance element connected in series with the second switch having a selector terminal switchable between the fifth impedance element and the second impedance element having a common terminal connected via the first switch to the ground terminal, and further comprising the third switch between the selector terminal of the second switch and the ground terminal.

5. The adaptive voltage divider according to claim 1, further comprising a series connection of a third voltage follower connected with a sixth impedance element, a seventh impedance element and a second amplifier, which is connectable in the third configuration in parallel with the series connection of the fifth impedance element and the second impedance element to minimize the effects of Common Mode Rejection Ratio.

6. The adaptive voltage divider according to claim 1, wherein the first branch and the second branch each comprise a chain of mutually loaded voltage dividers.

* * * * *